(12) United States Patent
Pritchard et al.

(10) Patent No.: US 12,532,746 B2
(45) Date of Patent: Jan. 20, 2026

(54) STRUCTURE WITH GATE OVER NON-ALIGNED SEMICONDUCTOR REGIONS

(71) Applicant: GlobalFoundries U.S. Inc., Malta, NY (US)

(72) Inventors: David Charles Pritchard, Schenectady, NY (US); Ramesh Raghavan, Bengaluru (IN); Thirunavukkarasu Ranganathan, Bangalore (IN); Rajesh Reddy Tummuru, Bengaluru (IN); Benoit Francois Claude Ramadout, Dresden (DE); Luca Pirro, Dresden (DE)

(73) Assignee: GlobalFoundries U.S. Inc., Malta, NY (US)

( * ) Notice: Subject to any disclaimer, the term of this patent is extended or adjusted under 35 U.S.C. 154(b) by 362 days.

(21) Appl. No.: 18/240,699

(22) Filed: Aug. 31, 2023

(65) Prior Publication Data

US 2025/0079343 A1 Mar. 6, 2025

(51) Int. Cl.
*H01L 23/00* (2006.01)
*H10D 30/01* (2025.01)
*H10D 62/10* (2025.01)

(52) U.S. Cl.
CPC ......... *H01L 23/576* (2013.01); *H10D 30/021* (2025.01); *H10D 62/126* (2025.01)

(58) Field of Classification Search
CPC .. H01L 23/576; H10D 30/021; H10D 62/126; H04L 9/0866; H04L 9/3278; G09C 1/00
See application file for complete search history.

(56) References Cited

U.S. PATENT DOCUMENTS

| | | | |
|---|---|---|---|
| 9,584,329 B1 | 2/2017 | Trimberger | |
| 9,666,582 B1 | 5/2017 | Li et al. | |
| 9,947,391 B1 | 4/2018 | Mahatme et al. | |
| 10,332,840 B2 * | 6/2019 | Tseng | G09C 1/00 |
| 2019/0147948 A1 | 5/2019 | Cheng | |

OTHER PUBLICATIONS

European Patent Application Serial No. 24159005.8-1218, Search Report dated Jul. 29, 2024, 7 pages.

* cited by examiner

*Primary Examiner* — David Vu
(74) *Attorney, Agent, or Firm* — David Cain; Hoffman Warnick LLC

(57) ABSTRACT

Embodiments of the disclosure provide a structure and related method for a gate over semiconductor regions that are not aligned. Structures according to the disclosure include a first semiconductor region extending from a first widthwise end to a second widthwise end within a substrate. A second semiconductor region is adjacent the first semiconductor region and extends from a first widthwise end to a second widthwise end within the substrate. The second widthwise end of the second semiconductor region is non-aligned with the second widthwise end of the first semiconductor region. A gate structure is over the substrate and extends widthwise over the first semiconductor region and the second semiconductor region.

20 Claims, 6 Drawing Sheets

STRUCTURE WITH GATE OVER NON-ALIGNED SEMICONDUCTOR REGIONS

TECHNICAL FIELD

Embodiments of the disclosure relate generally to integrated circuit (IC) structures. More specifically, embodiments of the disclosure provide structures and methods to provide a gate over non-aligned semiconductor regions, e.g., to increase variances in threshold voltage for a physical unclonable function (PUF) array.

BACKGROUND

A physical unclonable function (PUF) is a physical object capable of outputting a unique output ("response") based on a repeatable input ("challenge") to the object. Immutable characteristics of the PUF will dictate the output for a particular input. PUFs can be implemented via integrated circuits (IC) s in applications with high security requirements, including internet of things (IOT) settings, and may act against chip counterfeiting. In a "PUF array," multiple transistors provide a set of digital bits (similar to random access memory (RAM)) in which random variations on a die will affect each transistor's threshold voltage. The threshold voltage, in turn, controls whether each transistor will produce a high logic level or low logic level in response to an incoming signal. For the PUF array to be verifiable, the unique response must be repeatable under a variety of deployment settings and throughout the lifespan of the device.

SUMMARY

All aspects, examples and features mentioned below can be combined in any technically possible way.

Aspects of the disclosure provide a structure including: a first semiconductor region extending from a first widthwise end to a second widthwise end within a substrate; a second semiconductor region adjacent the first semiconductor region and extending from a first widthwise end to a second widthwise end within the substrate, wherein the second widthwise end of the second semiconductor region is non-aligned with the second widthwise end of the first semiconductor region; and a gate structure over the substrate and extending widthwise over the first semiconductor region and the second semiconductor region.

Further aspects of the disclosure provide a structure including: a physical unclonable function (PUF) array including a plurality of transistors on a substrate, wherein a first transistor of the plurality of transistors includes: a first semiconductor region extending from a first widthwise end to a second widthwise end within a substrate, a second semiconductor region adjacent the first semiconductor region and extending from a first widthwise end to a second widthwise end within the substrate, wherein the second widthwise end of the second semiconductor region is non-aligned with the second widthwise end of the first semiconductor region, and wherein the first semiconductor region and the second semiconductor region define source and drain regions, and a gate structure over the substrate and extending widthwise over the first semiconductor region and the second semiconductor region.

Additional aspects of the disclosure provide a method including: forming a first semiconductor region within a substrate, the first semiconductor region extending from a first widthwise end to a second widthwise end within a substrate; forming a second semiconductor region within the substrate adjacent the first semiconductor region, the second semiconductor region extending from a first widthwise end to a second widthwise end within the substrate, wherein the second widthwise end of the second semiconductor region is non-aligned with the second widthwise end of the first semiconductor region; and forming a gate structure over the substrate, the gate structure extending widthwise over the first semiconductor region and the second semiconductor region.

Two or more aspects described in this disclosure, including those described in this summary section, may be combined to form implementations not specifically described herein.

The details of one or more implementations are set forth in the accompanying drawings and the description below. Other features, objects and advantages will be apparent from the description and drawings, and from the claims.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

Figure 1:
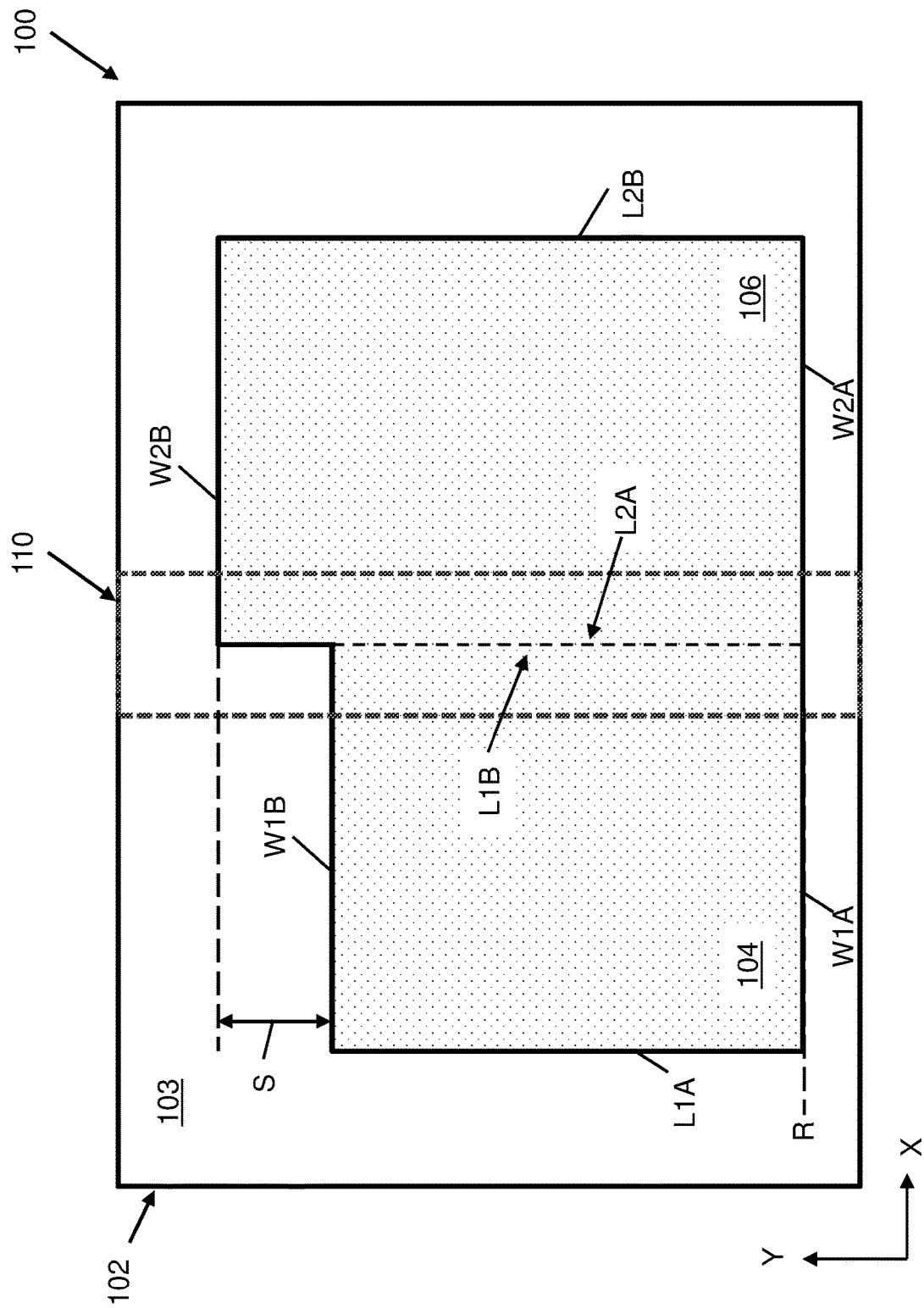
FIG. 1 shows a plan view of a structure with non-aligned semiconductor regions according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

A physical unclonable function (PUF) is a physical object capable of outputting a unique output ("response") based on a repeatable input ("challenge") to the object. Immutable characteristics of the PUF will dictate the output for a particular input. PUFs can be implemented via integrated circuits (IC) s in applications with high security requirements, including internet of things (IOT) settings, and may act against chip counterfeiting. In a "PUF array," multiple transistors provide a set of digital bits (similar to random access memory (RAM)) in which random variations on a die will affect each transistor's threshold voltage. The threshold voltage, in turn, controls whether each transistor will produce a high logic level or low logic level in response to an incoming signal. For the PUF array to be verifiable, the unique response must be repeatable under a variety of deployment settings and throughout the lifespan of the device.

Embodiments of the disclosure provide a structure and related method for a gate over semiconductor regions that are not aligned. The terms "not aligned" or "non-aligned" mean that one semiconductor region is not coaxial or substantially coaxial with an adjacent semiconductor region along its centerline axis. Hence, at least one sidewall at the end of one semiconductor region does not coincide with a corresponding sidewall at the same end of the adjacent semiconductor region. Structures according to the disclosure include a first semiconductor region extending from a first widthwise end to a second widthwise end within a substrate. A second semiconductor region is adjacent to the first semiconductor region and extends from a first widthwise end to a second widthwise end within the substrate. The second widthwise end of the second semiconductor region is non-aligned with the second widthwise end of the first semiconductor region. A gate structure is over the substrate and extends widthwise over the first semiconductor region and the second semiconductor region. During operation, the non-aligned semiconductor regions will increase the variation in threshold voltage for each transistor on the substrate, e.g., further randomizing the distribution of high and low voltage outputs in a PUF array.

Referring to FIG. 1, embodiments of the disclosure provide a structure 100 with a substrate 102, and a set of trench isolation (TI) regions of insulating material on various portions of substrate 102. Other portions of substrate 102 may be doped to define a first semiconductor region 104 and a second semiconductor region 106, which have non-aligned widthwise ends as discussed herein. Structure 100 represents part of a device formed of various transistors and distributed across a two-dimensional area in plane X-Y. Structure 100 may be defined in a layout, alternatively known as a "map," "design," "floor plan," or other term referring to the placement of various components (e.g., logic or memory cells and their individual transistors) within a two dimensional area. Structure 100 may be formed above substrate 102 of semiconductor material, which may be the base material on/within which further materials (e.g., variously doped well regions, transistor structures, insulator regions, and/or other electrical components of a device) are formed.

Substrate 102 may be at least partially formed of any currently known or later developed semiconductor material, which may include without limitation: silicon, germanium, silicon germanium, and substances consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and $X1+X2+X3+Y1+Y2+Y3+Y4=1$ (1 being the total relative mole quantity). Substrate 102 may be a bulk semiconductor layer, but in various embodiments may be a semiconductor on insulator (SOI) layer such as a fully depleted semiconductor on insulator (FDSOI) layer that is on a buried insulator layer, in which case additional insulating and semiconductor material (not shown) may be underneath the buried insulator layer, e.g., to provide a back gate region as known in the art. Trench isolations (TIs) 103 may be formed on various portions of substrate 102, each including one or more dielectric materials (e.g., oxide and/or nitride insulators, and/or other insulating materials including those having a low dielectric constant (i.e., any insulating material(s) with a dielectric constant "k" of less than approximately 3.9)), may be on or within substrate 102 to cover and/or isolate sets of semiconductor regions 104, 106 from each other.

Various portions of substrate 102 may be doped to provide semiconductor regions 104, 106 for defining various subcomponents (e.g., source regions, drain regions, channel regions, etc.) of transistors and/or other device structures formed thereon. A "dopant" refers to an element introduced into semiconductor to establish either p-type (acceptors) or n-type (donors) conductivity. Dopants are of two types: "donors" and "acceptors." N type implants are donors and P type are acceptors. In the case of a silicon substrate, common dopants may include, e.g., boron (B), and/or Indium (In), for p-type doping. For n-type doping, the doped element(s) may include, for example, phosphorous (P) arsenic (As), and/or antimony (Sb). Doping is the process of introducing impurities (dopants) into the semiconductor substrate, or elements formed on the semiconductor substrate, and is often performed with a mask (or other previously formed elements) in place so that only certain areas of the substrate will be doped. An ion implanter is typically employed for the actual implantation, but other types of doping may be implemented. An inert carrier gas such as nitrogen is usually applied to complete the dopant implantation, where applicable.

Usually in doping, a dopant, a dosage, and an energy level are specified and/or a resulting doping level may be specified. A dosage may be specified in the number of atoms per square centimeter ($cm^2$) and an energy level (specified in keV, kilo-electron-volts), resulting in a doping level (concentration in the substrate) of a number of atoms per cubic centimeter ($cm^3$). The number of atoms is commonly specified in exponential notation, where a number like "3E15" means 3 times 10 to the 15th power, or a "3" followed by 15 zeroes (3,000,000,000,000,000). An example of doping is implanting with B (boron) with a dosage of between about 1E12 and 1E13 atoms/$cm^2$, and an energy of about 40 to 80 keV to produce a doping level of between 1E17 and 1E18 atoms/$cm^3$. Doped portions of a substrate may be known in the art as a "well." A well commonly refers to the implanted/diffused region in semiconductor wafer needed to implement complementary metal oxide semiconductor (CMOS) cell. Depending on the attributes of structure 100, a well may be either n-type or p-type doped.

Although semiconductor regions 104, 106 may have a higher dopant concentration than other portions of substrate 102, the doping type and/or dopant concentration in each semiconductor region 104, 106 may not be uniform. For instance, as discussed herein, some portions of each semiconductor region 104, 106 (e.g., those below a gate structure) may have lighter amounts of doping to provide a channel region. In further implementations, semiconductor region(s) 104, 106 may be substantially uniformly doped and semiconductor material(s) with higher dopant concentrations may be formed thereon.

First semiconductor region 104 within substrate 102 may extend in a widthwise direction, e.g., along the Y axis as shown, from a first widthwise end W1A to a second widthwise end W1B. First semiconductor region 104 within substrate 102 also may extend in a lengthwise direction, e.g., along the X axis as shown, from a first lengthwise end L1A to a second lengthwise end L1B. Although first semiconductor region 104 is shown by example to be in a substantially quadrilateral (e.g., rectangular) shape within substrate 102, first semiconductor region 104 may have any conceivable geometry in plane X-Y yet may have a width and length relative it its outermost ends in each direction.

Second semiconductor region 106 within substrate 102, similarly to first semiconductor region 104, may extend in a widthwise direction, e.g., along the Y axis as shown, from a first widthwise end W2A to a second widthwise end W2B. Second semiconductor region 106 within substrate 102 also may extend in a lengthwise direction, e.g., along the X axis as shown, from a first lengthwise end L2A to a second lengthwise end L2B. Although first semiconductor region 104 is shown by example to be in a substantially quadrilateral (e.g., rectangular) shape within substrate 102, first semiconductor region 104 may have any conceivable geometry in plane X-Y yet may have a width and length relative it its outermost ends in each direction. First widthwise end W1A of first semiconductor region 104 may be substantially aligned or even coaxial with first widthwise end W2A of second semiconductor region 106, where desired. First semiconductor region 104 and second semiconductor region 106 may have substantially equal lengths (i.e., span along X axis) but may have different surface areas due to differences in width.

Semiconductor regions 104, 106 may partially abut each other, e.g., along a majority of adjacent ends, e.g., lengthwise ends L2A, L1B as shown. Remaining ends of semiconductor region(s) 104, 106 (e.g., ends L1A, W1A, W1B, W2A, W2B, L2B) may not abut the other semiconductor region, and instead may abut TI(s) 103 or otherwise abut the less highly doped semiconductor material within substrate 102. Semiconductor regions 104, 106 may be differently sized, e.g., they may have different widths as depicted in FIG. 1. Widthwise ends W1B, W2B may be non-aligned with each other. Due to the different widths of each semiconductor region 104, 106, widthwise end W1B of first semiconductor region 104 may be offset from widthwise end W2B by a distance S. Distance S may be a width that is less than a majority of the width of second semiconductor region 106. Thus, semiconductor region 104 horizontally abuts a majority of second semiconductor region 106. The size of distance S relative to the width of second semiconductor region 106 may be controlled to affect the threshold voltage of transistors formed on regions 104, 106 as discussed herein. Conversely, other widthwise ends W1A, W2A of regions 104, 106 optionally may be in substantial alignment (e.g., along line R as shown) such that the only significant differences in surface area between each region 104, 106 arise from the relative positions of widthwise ends W1B, W2B.

A gate structure 110 (shown in dashed lines in FIG. 1, and fully visible in FIGS. 3, 6) may be over substrate 102, extending widthwise (e.g., in the direction of the Y axis) over first semiconductor region 104 and second semiconductor region 106 such that it covers the lengthwise ends L1B, L2A. Gate structure 110 can be positioned over a channel region defined by or otherwise within semiconductor regions 104, 106. A voltage applied to a gate conductor of gate structure 110 that is at least equal to the threshold voltage may enable electrical conductivity between source and drain regions (e.g., S/D contacts 132 shown in FIGS. 3, 5 and discussed elsewhere herein) within and/or formed on semiconductor regions 104, 106.

Gate structure 110 thus may include, e.g., polycrystalline silicon, one or more electrically conductive metals, and/or other gate formation material(s) therein in addition to a gate dielectric material (not shown) for separating the conductive material(s) of gate structure 110 from semiconductor regions 104, 106. Gate structure 110 may include one or more spacers over semiconductor regions 104, 106 along its perimeter. Spacer(s) of gate structure 110 may be formed of dielectric materials (e.g., one or more insulative substances suitable for use as an insulator, and/or any other currently known or later developed insulative materials) to prevent electrical shorting between gate structure 110 and other electrically active materials formed on substrate 102. These and other subcomponents of gate structure 110 are not included in FIG. 1 to better illustrate the structural features of semiconductor regions 104, 106 in substrate 102. Gate structure 110 thus may cover portions of semiconductor regions 104, 106 that laterally abut each other in addition to portions of second semiconductor region 106 that do not laterally abut first semiconductor region 104.

Figure 2:
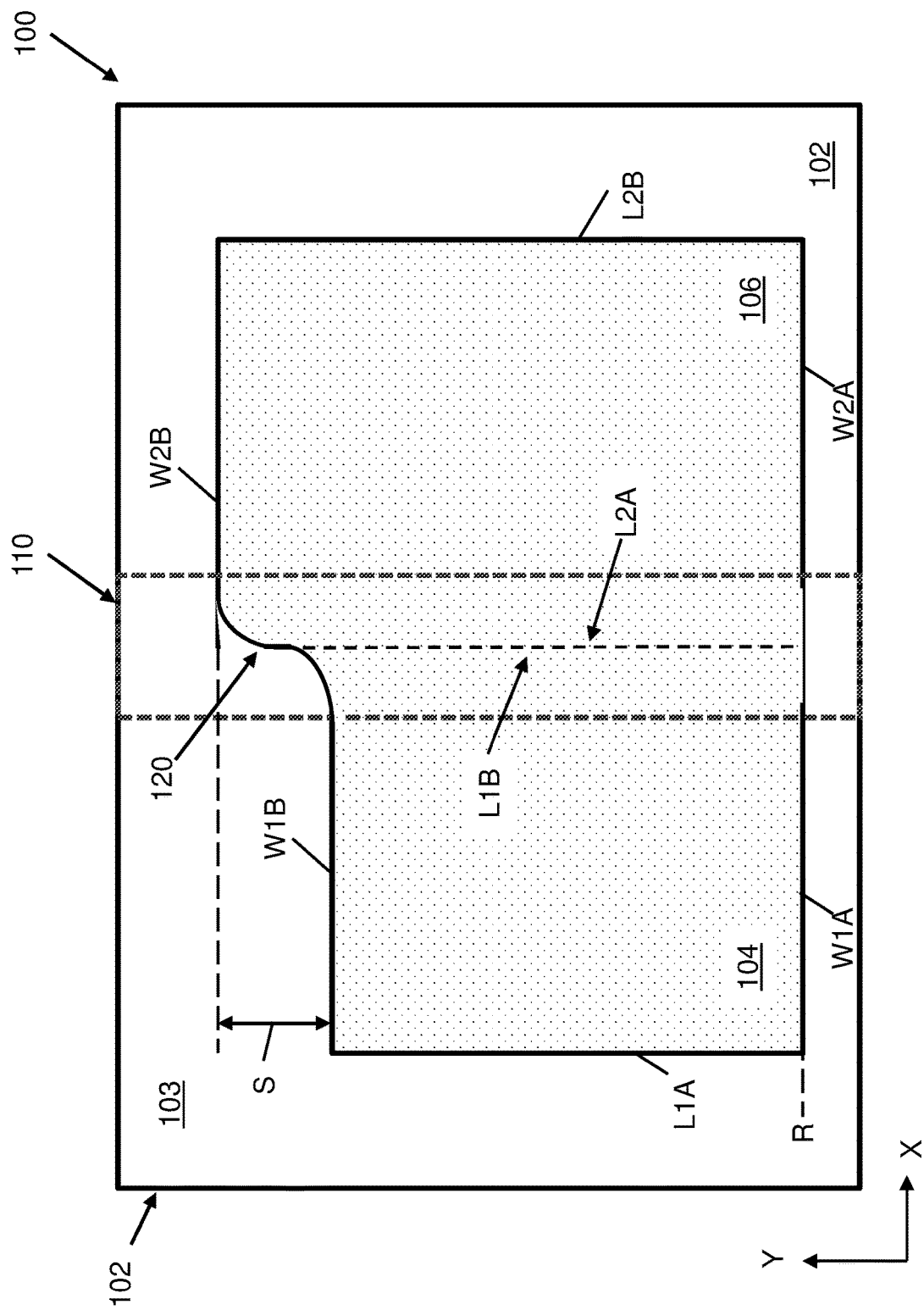
FIG. 2 shows a plan view of a structure with curvilinear segments joining semiconductor regions according to embodiments of the disclosure.

FIG. 2 depicts a further implementation of structure 100, e.g., in which a curvilinear segment 120 connects widthwise end W1B of first semiconductor region to widthwise end W2B of second semiconductor region 106. Curvilinear segment 120 may be formed, e.g., by changing the doping mask(s) used to form regions 104, 106. The shape and size of curvilinear segment 120 may further affect the threshold voltage of transistors formed over regions 104, 106, e.g., by further increasing or reducing the amount of semiconductor material(s) below gate structure 110. For instance, providing curvilinear segment 120 may reduce the surface area otherwise occupied by the corner segments of each semiconductor region 104, 106, and thus may slightly reduce the amount of variation in threshold voltage between each transistor within structure 100, while maintaining some variability in threshold voltage. As shown, gate structure 110 may cover an entirety of curvilinear segment 120. Other features of structure 100 may be the same or identical to other implementations discussed herein, regardless of whether curvilinear segment 120 is included.

Figure 3:
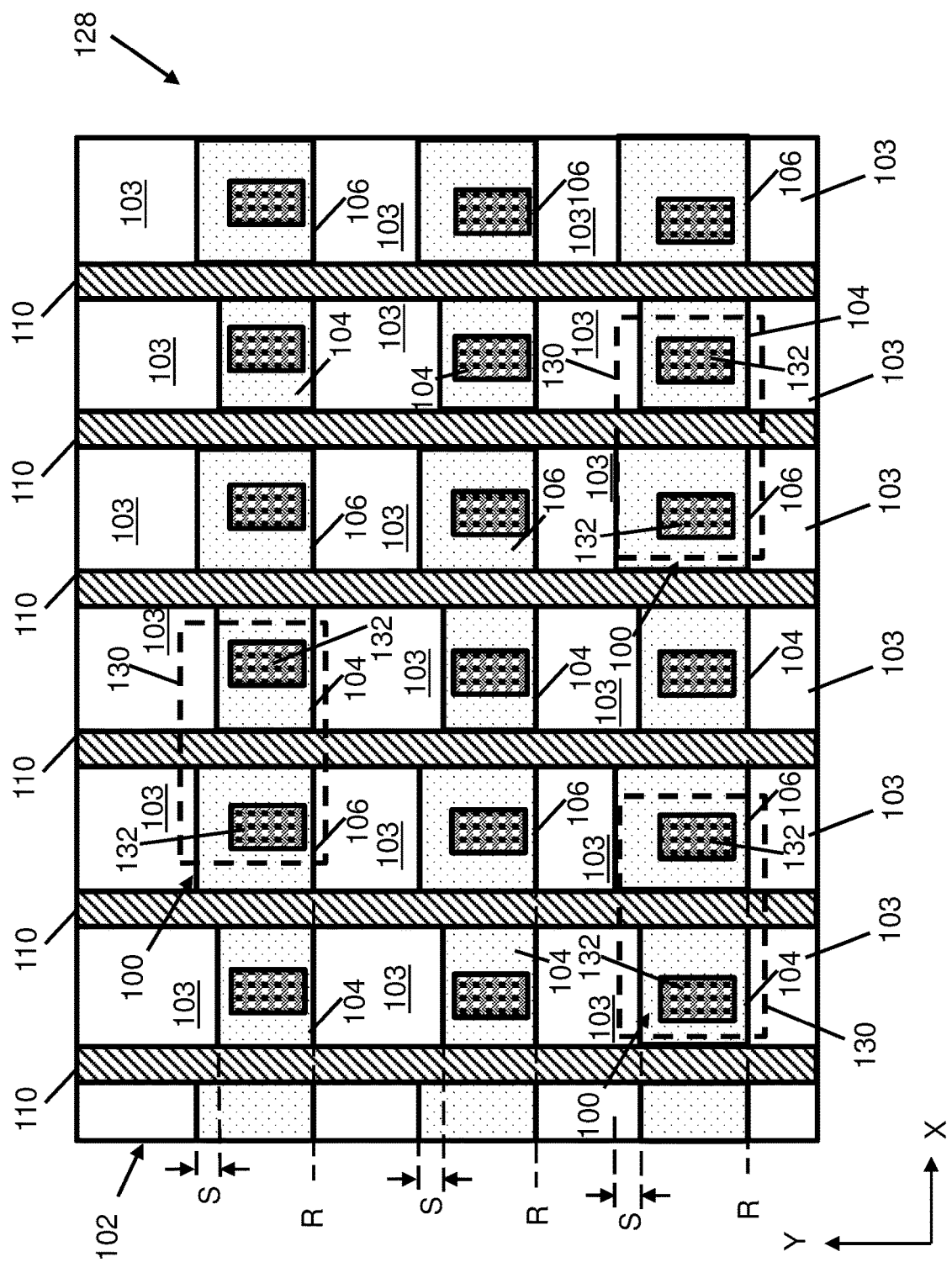
FIG. 3 shows a plan view of a structure in a PUF array according to embodiments of the disclosure.

FIG. 3 depicts a plan view of a physically unclonable function (PUF) array 128 having several PUF transistors 130, one or more of which may include structure 100 as discussed herein. Each PUF transistor 130 may include gate structure 110 extending widthwise over the boundary between semiconductor regions 104, 106, and over electrically inactive portions of substrate 102 located between adjacent PUF transistors 130. Some gate structures 110 may be electrically conductive, whereas other gate structures 110 may be non-conductive gate structures (sometimes known as "dummy gates") for separating some PUF transistors 130 from other transistors. As discussed herein, some inactive portions of substrate 102 may include insulative materials (e.g., TI(s) 103) formed therein to better isolate each PUF transistor 130 from each other. In PUF array 128, semiconductor regions 104, 106 may be substantially aligned (e.g., along a respective axis R) at one widthwise end but may be substantially non-aligned at another widthwise end, such that corresponding widthwise ends are separated by a distance S as discussed elsewhere herein. Source/drain (S/D) contacts 132, e.g., more highly conductive materials extending vertically to semiconductor material(s) therebelow, may be on semiconductor regions 104, 106. S/D contacts provide vertically extending source and drain couplings to transistor(s) 130 at desired locations.

Each gate structure 110 may be coupled to a power rail (not shown), which may be a larger conductive structure that may extend perpendicularly (e.g., along the X axis) for transmitting the voltage from a power supply to operate each PUF transistor 130 via its gate structure 110. Gate structures 110 alternatively may be coupled to a power supply source and/or similar voltage node through any currently known or later developed structure for delivering a voltage to transistor(s) 130. Certain portions of each gate structure 110 additionally may include electrically insulating materials (i.e., "diffusion breaks") to electrically isolate multiple PUF transistors 130 adjacent one gate structure 110 from each other.

Figure 4:
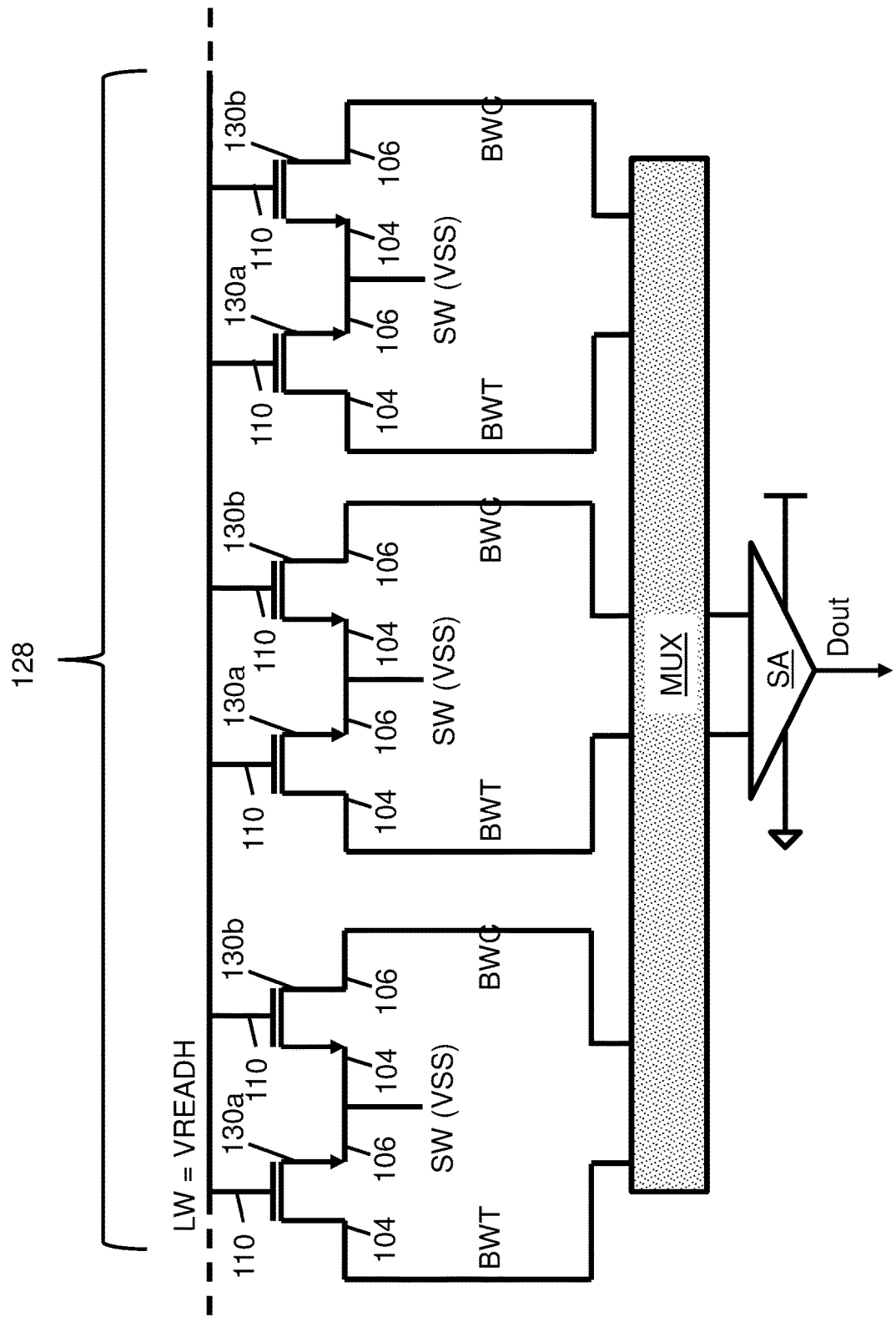
FIG. 4 shows a schematic diagram of a circuit for challenging and interpreting a response from pairs of transistors in a PUF array according to embodiments of the disclosure.

FIG. 4 depicts a circuit schematic illustrating a portion of PUF array 128, in which pairs of PUF transistors 130 (e.g., pairs of N-type transistors, such as N-channel field effect transistors (NFETs) (separately labeled 130a, 130b in each pair) may be in a circuit for generating a unique response to a challenge using combinations of PUF transistors 130a, 130b. It is understood that in most PUF arrays 128, there will be many more pairs of PUF transistors 130a, 130b, and three pairs of PUF transistors 130a, 130b are shown solely for clarity of illustration.

Each pair of PUF transistors 130a, 130b may include gate structure 110 between differently sized semiconductor regions 104, 106 (FIGS. 1, 2). Manufacturing variations combined with the different sizes of each semiconductor region 104, 106 will cause the threshold voltage of each PUF transistor 130a, 130b to vary. Each pair of PUF transistors 130a, 130b in PUF array 128 may be coupled at their gate to a word line ("WL") for carrying a read signal ("VREADH"). The logic level of the read signal may control whether a particular row of PUF transistors 130 in PUF array 128 will receive an input signal ("challenge"), and the threshold voltage of each PUF transistor 130a, 130b controls whether the read signal is capable of enabling current flow between drain and source. Thus, the physical structure of each PUF transistor 130a, 130b controls the threshold voltage and hence whether an incoming challenge will output a "one" or a "zero" voltage.

In the configuration shown, VREADH can be set, for example, so that it is at or above the threshold voltage for approximately half of the transistors in the array. When VREADH is applied to a word line WL, all pairs of PUF transistors 130a, 130b (e.g., pairs of NFETs) (also referred to herein as bitcells) in the same row are challenged. The different sizes of semiconductor regions 104, 106, in addition to other intrinsic structural differences and variations created during manufacture, will cause some PUF transistors 130a, 130b to have different threshold voltages from other PUF transistors 130a, 130b in the same PUF array 128. However, these variations do not necessarily cause each PUF transistor 130a, 130b to produce a different response (i.e., logic level) in response to VREADH on word line WL. More particularly, a source line ("SL") may be coupled to a voltage supply ("VSS") (e.g., to ground) and to source terminals defined within semiconductor regions 104, 106 of each PUF transistor 130a, 130b in a pair in PUF array 128. Semiconductor regions 104, 106 of each PUF transistor 130a, 130b in the pair may be coupled to complementary bit lines (i.e., a "bit line true" (BLT) or "bit line complementary" (BLC)), respectively, for transmitting a pair of binary digits ("bits") to a multiplexer ("MUX"). During the challenge operation, BLT and BLC can be pre-charged. When VREADH on WL goes high, the PUF transistor with the lower threshold voltage will turn on. If PUF transistor 130a turns on, the voltage on BLT will be pulled down to ground; whereas, if PUF transistor 130b turns on, the voltage on BLC will be pulled down to ground. The multiplexer can select the response from one or more pairs of PUF transistors 130a, 130b in the row to for transmission to a sense amplifier ("SA") coupled thereto. The sense amplifier may amplify and interpret the incoming data from BLT and BLC connected to PUF transistors 130a, 130b to produce a data output ("Dout") indicating the response to a challenge. For example, if BLT is low and BLC is high, Dout can be a logic 0; whereas, if BLT is high and BLC is low, Dout can be a logic 1 or vice versa. It should be noted that each pair of transistors (i.e., each bitcell) can be repeatedly challenged prior to PUF key generation to ensure that Dout will be consistent (i.e., stable). Generally, Dout will be stable if the absolute value of the threshold voltage delta between the two transistors in the pair is, for example, greater than some predetermined amount (e.g., 35 mV). Only bitcells with stable outputs are mapped for use in a PUF key.

Thus, with a simple and repeatable circuit, each PUF transistor 130a, 130b in PUF array 128 may be challenged using a signal from word line WL to produce a unique response. Embodiments of the disclosure include semiconductor regions 104, 106 of varying size to increase the variation in threshold voltage in each PUF transistor 130a, 130b of PUF array 128. The variation in threshold voltage for each PUF transistor 130a, 130b in PUF array 128 may partially or fully define the unique response that PUF array 128 will generate in response to a challenge. Further, the differences in threshold voltage between each PUF transistor 130a, 130b of PUF array 128 may be significant enough to ensure that PUF transistors 130 generate the unique response reliably in response to each challenge.

Figure 5:
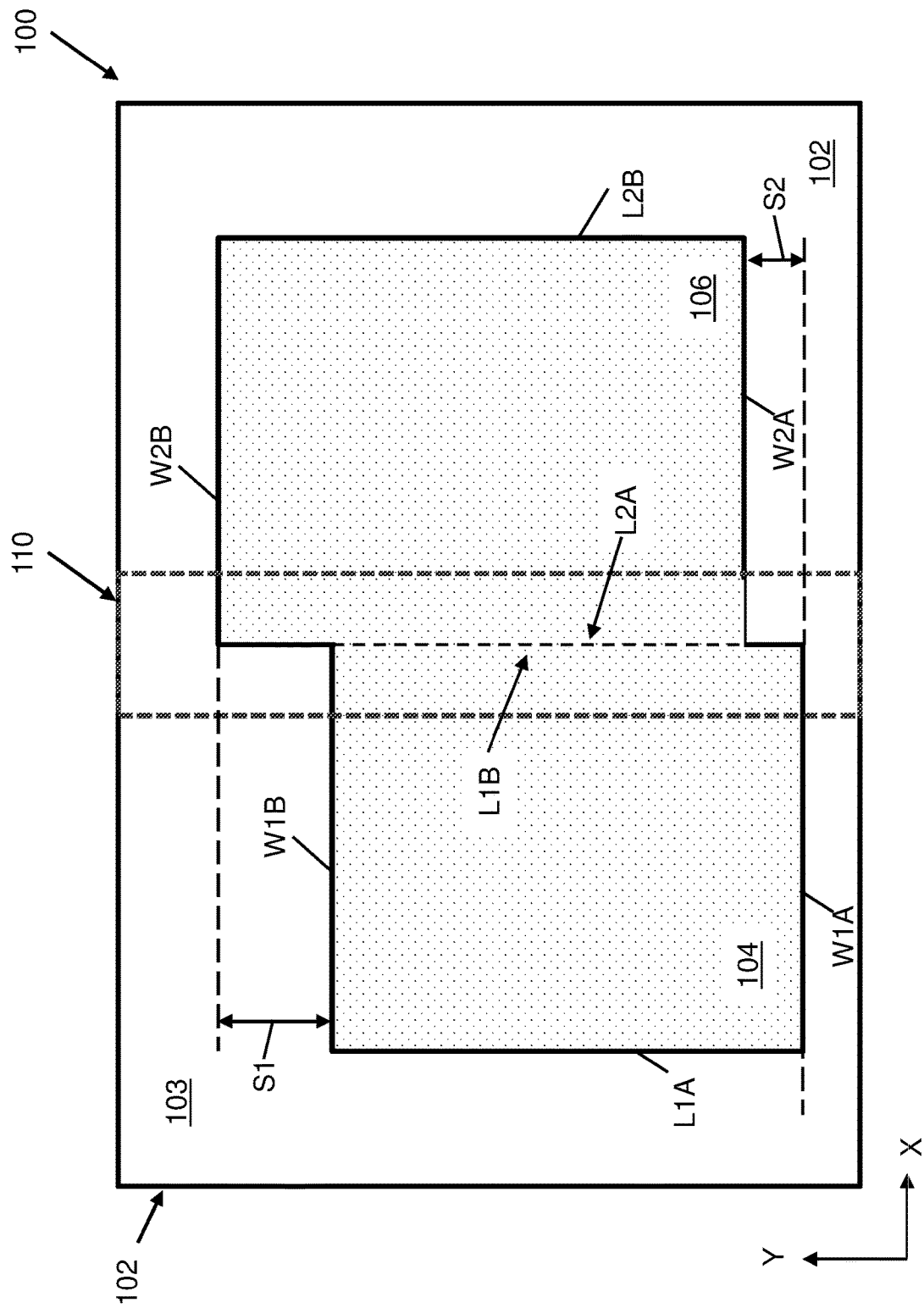
FIG. 5 shows a plan view of a structure with semiconductor regions having multiple non-aligned widthwise ends according to further embodiments of the disclosure.

FIG. 5 depicts a further example of structure 100, in which pairs of adjacent semiconductor regions 104, 106 are non-aligned at opposing widthwise ends. As discussed elsewhere herein, a distance S1 may separate widthwise end W1B of first semiconductor region 104 from widthwise end W2B of second semiconductor region 106. Optionally, widthwise end W1A of first semiconductor region 104 is also non-aligned with widthwise end W2A of second semiconductor region 106, such that a distance S2 separates widthwise ends W1A, W2B. Distances S1, S2 may be different from each other and may be user defined to increase or reduce the variations in threshold voltage for each transistor formed on semiconductor regions 104, 106.

Figure 6:
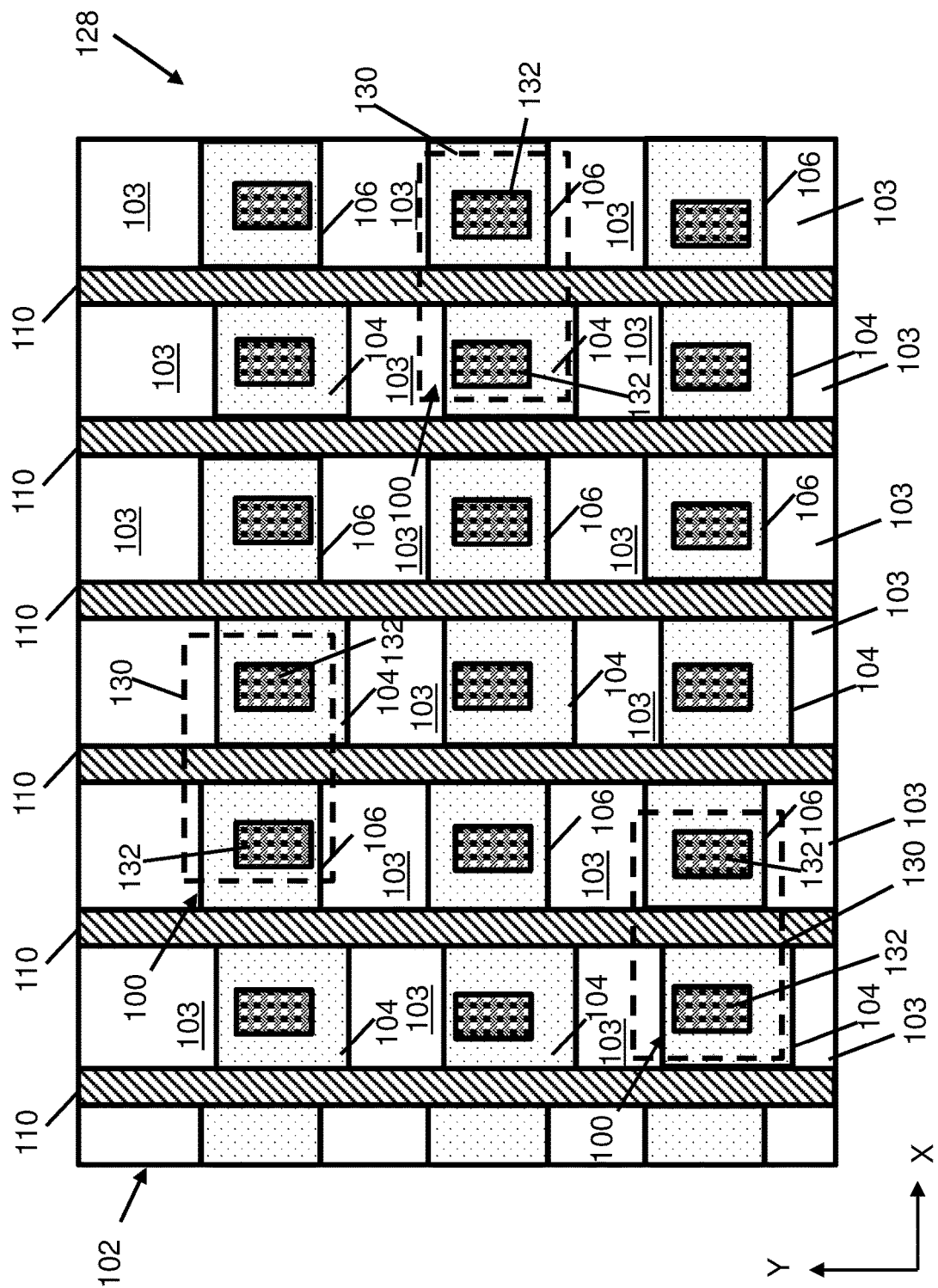
FIG. 6 shows a plan view of a structure in a PUF array with semiconductor regions having multiple non-aligned widthwise ends according to embodiments of the disclosure.

Referring to FIGS. 5 and 6 together, each PUF transistor 130 in PUF array 128 may have similar or even identical lengths (e.g., as measured along the X axis) but may have different widths (e.g., as measured along the Y axis). Transistors 130 of PUF array 128 each may be on a pair of semiconductor regions 104, 106 that may have different sizes, and in some cases, each of the various semiconductor regions 104, 106 in PUF array 128 may have a unique surface area. Further varying the size of each semiconductor region 104, 106 in the design of PUF array 128 may cause each unit of a device produced from the same design to have a unique electrical response to an incoming challenge. Embodiments of PUF array 128 in which semiconductor regions 104, 106 do not have any aligned widthwise ends optionally may be implemented with curvilinear segments 120 (FIG. 2) without otherwise altering the various structural features discussed herein. The presence of curvilinear segments 120 and/or non-alignment of regions 104, 106 at both widthwise ends is not necessarily required to provide an operational PUF array 128 and other embodiments discussed herein (e.g., those with semiconductor regions 104, 106 having one aligned widthwise end) may be used where desired.

The disclosure also provides methods of forming structure 100 (FIGS. 1, 2, 5) and/or PUF array 128 (FIGS. 3, 4, 6). Referring to FIG. 1 as an example, methods of the disclosure may include forming semiconductor region 104 within substrate 102, e.g., by doping selected portions of substrate 102 with a doping mask and/or using any currently known or later developed doping technique. In the same instance or a successive instance of doping, methods of the disclosure may include forming second semiconductor region 106 within substrate 102 adjacent first semiconductor region 104. In some cases, a designer or manufacturer may rely upon marker layers and/or additional design rule check (DRC) rules to produce the differently sized semiconductor regions 104, 106.

The forming of semiconductor regions 104, 106 can be controlled such that the widthwise end of one semiconductor region (e.g., first semiconductor region 104) is non-aligned with the corresponding widthwise end of the other semiconductor region (e.g., second semiconductor region 106). Gate structure 110 can be formed over semiconductor regions 104, 106 (e.g., by forming a gate structure and optionally a subsequent metal gate replacement) such that gate structure 110 extends widthwise over semiconductor regions 104, 106. The doping masks and/or other techniques for shaping semiconductor regions 104, 106 may be further modified to produce curvilinear segment(s) 120 (FIG. 2), multiple non-aligned widthwise ends (e.g., as shown in FIG. 5), and/or other structural features discussed herein.

Embodiments of the disclosure provide various technical and commercial advantages, examples of which are discussed herein. Embodiments of structure 100 and/or PUF array 128, and methods to form the same, effectively produce mismatch in the threshold voltage of various transistors 130 in a PUF array without significantly affecting the current needed to operate transistor(s) 130 and/or the surface area that transistor(s) 130 occupy on a device. In addition, embodiments of the disclosure are scalable over larger and smaller surface areas without significant change to the manufacturing process(es) needed to form PUF array 128. Increasing the variation in threshold voltage by changing the size of semiconductor regions 104, 106 may aid bit stability within PUF array 128 when transistors 130 are electrically challenged, i.e., embodiments of the disclosure will avoid the same PUF array 128 from returning different responses when challenged multiple times.

Aspects of the present disclosure are described above with reference to flowchart illustrations and/or block diagrams of methods and apparatus (systems) according to embodiments of the disclosure. It will be understood that each block of the flowchart illustrations and/or block diagrams, and combinations of blocks in the flowchart illustrations and/or block diagrams, can be implemented by hardware and/or software (e.g., computer program instructions). Where implemented with the aid of computer program instructions, such instructions for implementing methods of the disclosure may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

As used herein, the term "configured," "configured to" and/or "configured for" can refer to specific-purpose patterns of the component so described. For example, a system or device configured to perform a function can include a computer system or computing device programmed or otherwise modified to perform that specific function. In other cases, program code stored on a computer-readable medium (e.g., storage medium), can be configured to cause at least one computing device to perform functions when that program code is executed on that computing device. In these cases, the arrangement of the program code triggers specific functions in the computing device upon execution. In other examples, a device configured to interact with and/or act upon other components can be specifically shaped and/or designed to effectively interact with and/or act upon those components. In some such circumstances, the device is configured to interact with another component because at least a portion of its shape complements at least a portion of the shape of that other component. In some circumstances, at least a portion of the device is sized to interact with at least a portion of that other component. The physical relationship (e.g., complementary, size-coincident, etc.) between the device and the other component can aid in performing a function, for example, displacement of one or more of the device or other component, engagement of one or more of the device or other component, etc.

The descriptions of the various embodiments of the present disclosure have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   a first semiconductor region extending from a first widthwise end to a second widthwise end within a substrate;
   a second semiconductor region adjacent the first semiconductor region and extending from a first widthwise end to a second widthwise end within the substrate, wherein the second widthwise end of the second semiconductor region is non-aligned with the second widthwise end of the first semiconductor region; and
   a gate structure over the substrate and extending widthwise over the first semiconductor region and the second semiconductor region.

2. The structure of claim 1, wherein the first widthwise end of the first semiconductor region is substantially aligned with the first widthwise end of the second semiconductor region.

3. The structure of claim 1, wherein the first widthwise end of the first semiconductor region is non-aligned with the first widthwise end of the second semiconductor region.

4. The structure of claim 1, wherein a length of the first semiconductor region is substantially equal to a length of the second semiconductor region.

5. The structure of claim 1, wherein the first semiconductor region and the second semiconductor region define a respective source and drain region of a physical unclonable function (PUF) transistor within an array of PUF transistors.

6. The structure of claim 1, wherein the first semiconductor region horizontally abuts a majority of a width of the second semiconductor region.

7. The structure of claim 1, further comprising a curvilinear segment below the gate structure and extending from the second widthwise end of the first semiconductor region to the second widthwise end of the second semiconductor region.

8. The structure of claim 1, wherein the substrate is one of a bulk semiconductor layer and a semiconductor on insulator (SOI) layer.

9. A structure comprising:
 a physical unclonable function (PUF) array including a plurality of transistors on a substrate, wherein a first transistor of the plurality of transistors includes:
  a first semiconductor region extending from a first widthwise end to a second widthwise end within a substrate,
  a second semiconductor region adjacent the first semiconductor region and extending from a first widthwise end to a second widthwise end within the substrate, wherein the second widthwise end of the second semiconductor region is non-aligned with the second widthwise end of the first semiconductor region, and wherein the first semiconductor region and the second semiconductor region define source and drain regions, and
  a gate structure over the substrate and extending widthwise over the first semiconductor region and the second semiconductor region.

10. The structure of claim 9, wherein the first widthwise end of the first semiconductor region is substantially aligned with the first widthwise end of the second semiconductor region within the first transistor.

11. The structure of claim 9, wherein the first widthwise end of the first semiconductor region is non-aligned with the first widthwise end of the second semiconductor region within the first transistor.

12. The structure of claim 9, wherein a length of the first semiconductor region is substantially equal to a length of the second semiconductor region within the first transistor.

13. The structure of claim 9, further comprising a curvilinear segment within the first transistor below the gate structure and extending from the second widthwise end of the first semiconductor region to the second widthwise end of the second semiconductor region.

14. The structure of claim 9, wherein the substrate is one of a bulk semiconductor layer and a semiconductor on insulator (SOI) layer.

15. A method comprising:
 forming a first semiconductor region within a substrate, the first semiconductor region extending from a first widthwise end to a second widthwise end within a substrate;
 forming a second semiconductor region within the substrate adjacent the first semiconductor region, the second semiconductor region extending from a first widthwise end to a second widthwise end within the substrate, wherein the second widthwise end of the second semiconductor region is non-aligned with the second widthwise end of the first semiconductor region; and
 forming a gate structure over the substrate, the gate structure extending widthwise over the first semiconductor region and the second semiconductor region.

16. The method of claim 15, wherein forming the first semiconductor region includes forming the first widthwise end of the first semiconductor region in substantial alignment with the first widthwise end of the second semiconductor region.

17. The method of claim 15, wherein forming the first semiconductor region includes forming the first widthwise end of the first semiconductor region out of alignment with the first widthwise end of the second semiconductor region.

18. The method of claim 15, wherein the second semiconductor region is formed with a length substantially equal to a length of the first semiconductor region.

19. The method of claim 15, further comprising forming a curvilinear segment extending from the second widthwise end of the first semiconductor region to the second widthwise end of the second semiconductor region, wherein the gate structure is formed over the curvilinear segment.

20. The method of claim 15, wherein the substrate is one of a bulk semiconductor layer and a semiconductor on insulator (SOI) layer.

* * * * *